(12) United States Patent
Mimura et al.

(10) Patent No.: US 8,754,667 B2
(45) Date of Patent: Jun. 17, 2014

(54) SEMICONDUCTOR DEVICE TEST METHOD AND SEMICONDUCTOR DEVICE

(75) Inventors: Chiaki Mimura, Yokohama (JP); Kazuhiko Shimabayashi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 550 days.

(21) Appl. No.: 13/035,581

(22) Filed: Feb. 25, 2011

(65) Prior Publication Data

US 2011/0227599 A1 Sep. 22, 2011

(30) Foreign Application Priority Data

Mar. 19, 2010 (JP) .................................. 2010-064507

(51) Int. Cl.
*G01R 31/26* (2014.01)
(52) U.S. Cl.
USPC ............ 324/762.01; 324/762.02; 324/762.03; 324/762.05
(58) Field of Classification Search
USPC ............. 324/762.01–762.03, 762.06–762.09, 324/613, 750.3; 438/14–18
See application file for complete search history.

(56) References Cited

U.S. PATENT DOCUMENTS

| 5,237,536 | A | * | 8/1993 | Ohtsuki | .................... | 365/230.06 |
| 5,497,079 | A | * | 3/1996 | Yamada et al. | .......... | 324/756.07 |
| 7,135,895 | B2 | | 11/2006 | Komura | | |
| 7,610,531 | B2 | * | 10/2009 | Dhong et al. | .................. | 714/724 |
| 8,134,383 | B2 | | 3/2012 | Yoshikawa | | |
| 2003/0202395 | A1 | * | 10/2003 | Lee et al. | ....................... | 365/200 |
| 2004/0117706 | A1 | * | 6/2004 | Maeno | .......................... | 714/726 |
| 2010/0090705 | A1 | * | 4/2010 | Yoshikawa | .................... | 324/537 |
| 2011/0140734 | A1 | * | 6/2011 | Miyase et al. | ................... | 326/16 |

FOREIGN PATENT DOCUMENTS

| JP | 2004-184345 A | 7/2004 |
| JP | 2006-14065 A | 1/2006 |
| JP | 2009-71089 A | 4/2009 |
| WO | WO-2008/102433 A1 | 8/2008 |
| WO | WO 2010021233 A1 * | 2/2010 |

OTHER PUBLICATIONS

Japanese Office Action mailed Oct. 8, 2013 for corresponding Japanese Application No. 2010064507, with Partial English-language Translation.

* cited by examiner

*Primary Examiner* — Huy Q Phan
*Assistant Examiner* — Adam Clarke
(74) *Attorney, Agent, or Firm* — Fujitsu Patent Center

(57) ABSTRACT

A transition delay test is conducted such that an internal circuit that is a test object circuit in a semiconductor device is divided into a plurality of circuit blocks and a determination test is conducted while changing concurrently operating circuit blocks, a power supply noise generated during conduction of the determination test is detected, a suitable circuit scale on which the transition delay test can be normally conducted without being affected by the influence of the power supply noise is determined based on the result of the determination test and the detected power supply noise, and clocks to be supplied to the circuit blocks are controlled based on the determination result to limit the number of the concurrently operating circuit blocks.

15 Claims, 6 Drawing Sheets

F I G. 3A
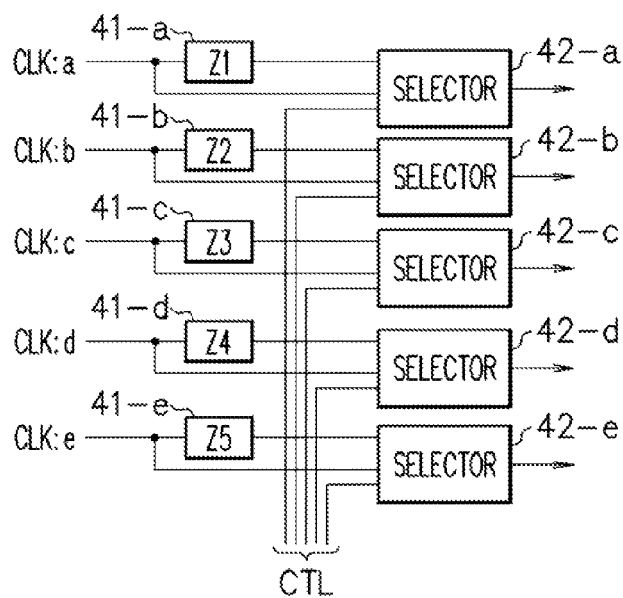
F I G. 3B
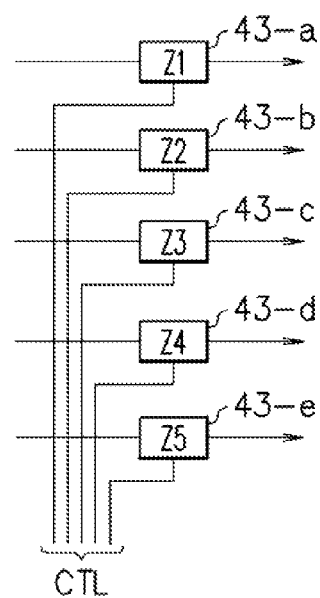
F I G. 3C
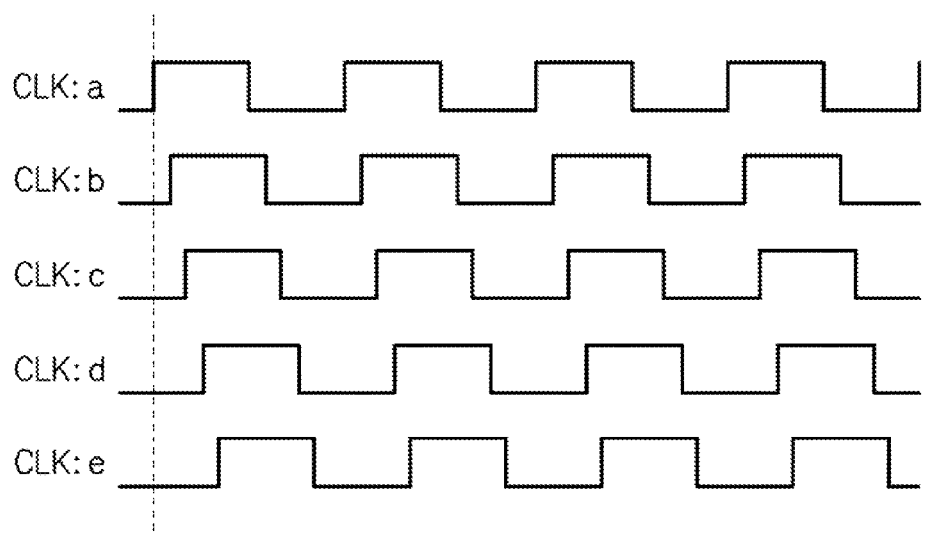

F I G. 4A
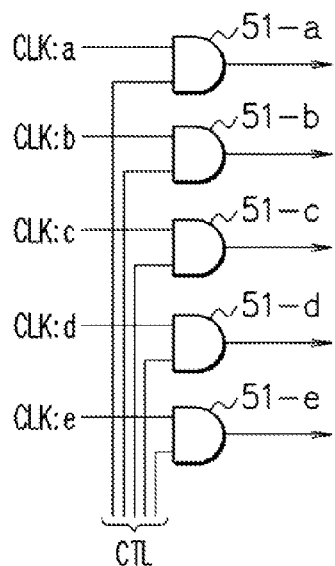
F I G. 4B
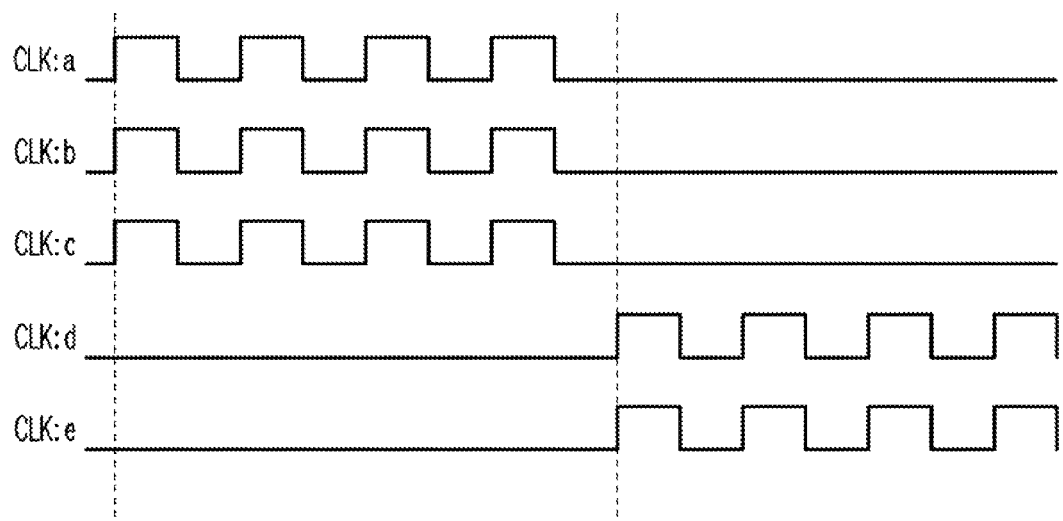

SEMICONDUCTOR DEVICE TEST METHOD AND SEMICONDUCTOR DEVICE

CROSS-REFERENCE TO RELATED APPLICATION

This application is based upon and claims the benefit of priority of the prior Japanese Patent Application No. 2010-064507, filed on Mar. 19, 2010, the entire contents of which are incorporated herein by reference.

FIELD

The embodiment discussed herein is directed to a semiconductor device test method and a semiconductor device.

BACKGROUND

One of operation tests of the semiconductor device is a transition delay test (TDT) evaluating a delay. In the transition delay test, a signal pattern to generate a signal change upon application of clock is set in flip-flops in the semiconductor device that is a test object by a scan shift or the like, and two pulses (clocks) at high speed are applied from an external part. The clock application for the first time generates a signal change and the clock application for the second time captures the changed signal in an arbitrary flip-flop. By comparing and determining whether the captured changed signal coincides with an expected value, the determination whether the delay in the semiconductor device satisfies the condition as non-defective or not is performed. More specifically, in the transition delay test, when the changed signal coincides with the expected value, the semiconductor device is determined as non-defective, whereas when the changed signal does not coincide with the expected value, the semiconductor device is determined as defective. Causes of occurrence of defective include various ones such as the switching noise, the configuration of design for test (DFT), the measurement circumference, the transistor characteristics and so on.

Further, a semiconductor device in which a power supply noise measurement cell composed of a MOS transistor having a gate connected to a power supply noise measurement point in the semiconductor device, a source connected to a determination reference voltage supply terminal, and a drain connected to a measurement terminal is installed to enable measurement of the power supply noise is proposed. This semiconductor device supplies the determination reference voltage to the source via the determination reference voltage supply terminal and monitors, at the measurement terminal, the change in the drain current with respect to variation in a gate-source voltage or the change of the ON/OFF state according to the power supply noise to measure the power supply noise (see, for example, Patent Document 1).

[Patent Document 1] Japanese Laid-open Patent Publication No. 2004-184345

In the transition delay test, the test is conducted while the semiconductor device operates under conditions more strict than the actual use conditions such that the signal changes are generated in the flip-flops in the semiconductor device at the same time. In other words, the transition delay test is conducted while a number of flip-flops that is nearly impossible under the actual use conditions operate at the same time. Therefore, when the transition delay test is conducted in a large-size semiconductor device having a huge number of flip-flops, the semiconductor device may be determined, due to the influence of the generated noise, as defective which will be determined as non-defective without the influence of the noise. In other words, the delay increases due to the influence of the power supply noise (a drop of the power supply voltage) generated by the operation (switching relating to the signal change) or the like of the huge number of flip-flops, with the result that the semiconductor device may be determined as defective.

SUMMARY

According to an aspect of the embodiment, provide is a semiconductor device test method, including: conducting a determination test of a test object circuit in a semiconductor device divided into a plurality of circuit blocks, while changing concurrently operating circuit blocks; detecting a power supply noise generated in the semiconductor device during conduction of the determination test; determining a circuit scale relating to conduction of an operation test based on a result of the conducted determination test and the detected power supply noise; and performing the operation test on the test object circuit controlling clocks to be supplied to the circuit blocks so that the circuit scale of the concurrently operating circuit blocks does not exceed the determined circuit scale.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 3A to FIG. 3C are diagrams illustrating examples of a clock control circuit of the semiconductor device in this embodiment;

FIG. 4A and FIG. 4B are diagrams illustrating another example of the clock control circuit of the semiconductor device in this embodiment;

DESCRIPTION OF EMBODIMENTS

Hereinafter, an embodiment will be described based on the drawings.

Figure 1:
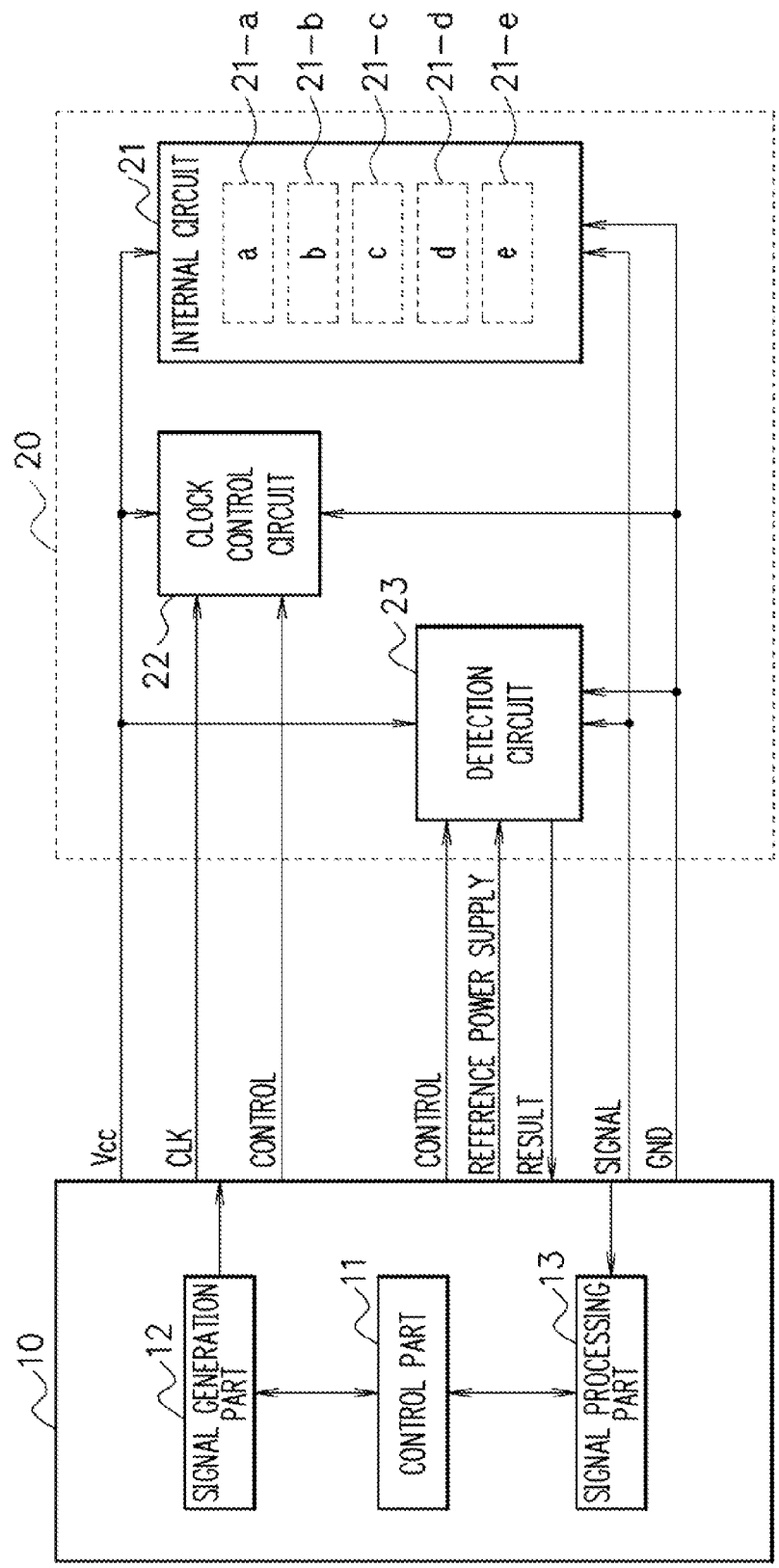
FIG. 1 is a diagram illustrating a configuration example of a test system of a semiconductor device in an embodiment.

FIG. 1 is a block diagram illustrating a configuration example of a test system of a semiconductor device in an embodiment. Note that FIG. 1 illustrates only elemental features for conducting a transition delay test in the test system of the semiconductor device in this embodiment.

In FIG. 1, numeral 10 denotes a testing device (tester) of a semiconductor device, and numeral 20 denotes a semiconductor device as a test object device (for example, a chip on which a test object circuit is mounted).

The testing device 10 has a control part 11, a signal generation part 12, and a signal processing part 13.

The control part 11 controls functional parts in the testing device 10. The control part 11 is composed of, for example, a CPU (Central Processing Unit), memory and so on, and the CPU reads out a program stored in the memory or the like and executes the program to thereby control the functional parts to conduct the transition delay test of the semiconductor device 20.

The signal generation part 12 generates various signals to be supplied to the semiconductor device 20 and outputs the signals according to the control by the control part 11. The various signals to be supplied to the semiconductor device 20 include a control signal controlling a clock to be supplied to an internal circuit of the semiconductor device 20, a control signal for acquiring the level of the power supply noise, a signal for setting a signal pattern to conduct the transition delay test in the internal circuit of the semiconductor device 20 and so on.

The signal processing part 13 performs predetermined signal processing in response to the signal from the semiconductor device 20 and outputs processing result to the control part 11. The signal processing part 13, for example, receives a signal that has been subjected to signal change in the transition delay test, and compares whether the changed signal coincides with an expected value or not to determine the result (OK or NG) of the transition delay test, and outputs the determination to the control part 11.

The semiconductor device 20 has an internal circuit 21, a clock control circuit 22, and a detection circuit 23. To the functional parts (including the internal circuit 21, the clock control circuit 22, and the detection circuit 23) in the semiconductor device 20, a power supply voltage (Vcc) and a reference potential (GND) are supplied from the testing device 10.

The internal circuit 21 is a circuit which includes flip-flops, logic circuits and so on and implements a predetermined function in the semiconductor device 20. The internal circuit 21 is a circuit that is the test object of the transition delay test. When conducting the transition delay test, a signal pattern to generate signal change upon application of clock is set in the flip-flops of the internal circuit 21 by scan shift or the like based on the signal from the testing device 10. Thereafter, a clock for the first time for generating a signal change and a clock for the second time for capturing the changed signal in an arbitrary flip-flop are applied to the internal circuit 21.

In this embodiment, the internal circuit 21 is divided into five circuit blocks such that the numbers of the flip-flops included in the blocks are substantially equal (such that each circuit scale is substantially equal), and the five circuit blocks are referred to as circuit blocks 21-*a*, 21-*b*, 21-*c*, 21-*d*, 21*e*, respectively. More specifically, the internal circuit 21 is divided such that each of the circuit blocks 21-*a* to 21-*e* has flip-flops corresponding to 20% of the total number of flip-flops existing in the internal circuit 21. In this embodiment, the transition delay test can be conducted taking the divided circuit block 21-*a*, 21-*b*, 21-*c*, 21-*d*, 21-*e* as a unit.

The clock control circuit 22 is supplied with the clock (CLK) and the control signal from the testing device 10. The clock control circuit 22 controls the clock to be supplied to the internal circuit 21 (more specifically, each of the circuit blocks 21-*a*, 21-*b*, 21-*c*, 21-*d*, 21-*e*) based on the supplied control signal when conducting the transition delay test.

The detection circuit 23 is supplied with the control signal and the reference power supply (corresponding to Vcc without power supply noise) and supplies measurement result of the power supply noise to the testing device 10. The detection circuit 23 performs monitoring of the power supply noise by comparing voltage levels of a predetermined comparison voltage generated based on the reference power supply and the power supply voltage (Vcc), and outputs the result (the level of the power supply noise) to the testing device 10.

Figure 2:
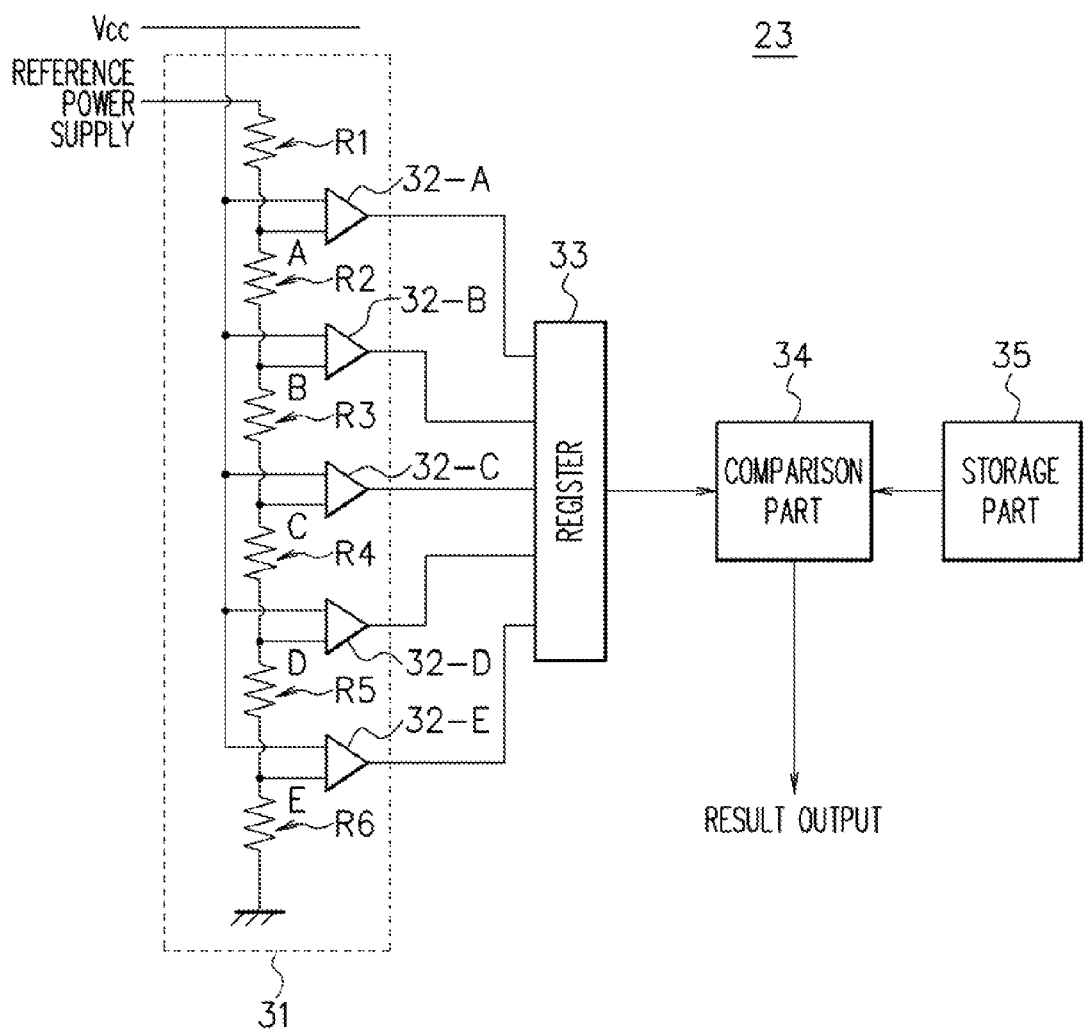
FIG. 2 is a diagram illustrating a configuration example of a detection circuit of the semiconductor device in this embodiment.

FIG. 2 is a block diagram illustrating a configuration example of the detection circuit 23 of the semiconductor device 20. The detection circuit 23 has a determination part 31, a register 33, a comparison part 34, and a storage part 35.

The determination part 31 has comparators 32-A, 32-B, 32-C, 32-D, 32-E and resistors R1, R2, R3, R4, R5, R6. The resistors R1, R2, R3, R4, R5, R6 are connected in series in this order between a power supply line to which the reference power supply is supplied from the testing device 10 and the reference potential GND. Further, each of the comparators 32-A to 32-E has one input connected to a power supply line to which the power supply voltage (Vcc) is supplied from the testing device 10 and another input connected to an interconnection point of the respective resistors R1, R2, R3, R4, R5, R6 connected in series.

More specifically, to one input of each of the comparators 32-A to 32-E, the power supply voltage (Vcc) is supplied. Further, the other input of the comparator 32-A is connected to a connection point of the resistors R1 and R2, and the potential at the connection point (referred to as a voltage level A) is inputted to the other input of the comparator 32-A. Similarly, the other input of the comparator 32-B is connected to a connection point of the resistors R2 and R3, and the potential at the connection point (referred to as a voltage level B) is inputted to the other input of the comparator 32-B. The other input of the comparator 32-C is connected to a connection point of the resistors R3 and R4, and the potential at the connection point (referred to as a voltage level C) is inputted to the other input of the comparator 32-C. The other input of the comparator 32-D is connected to a connection point of the resistors R4 and R5, and the potential at the connection point (referred to as a voltage level D) is inputted to the other input of the comparator 32-D. The other input of the comparator 32-E is connected to a connection point of the resistors R5 and R6, and the potential at the connection point (referred to as a voltage level E) is inputted to the other input of the comparator 32-E.

Figure 6:
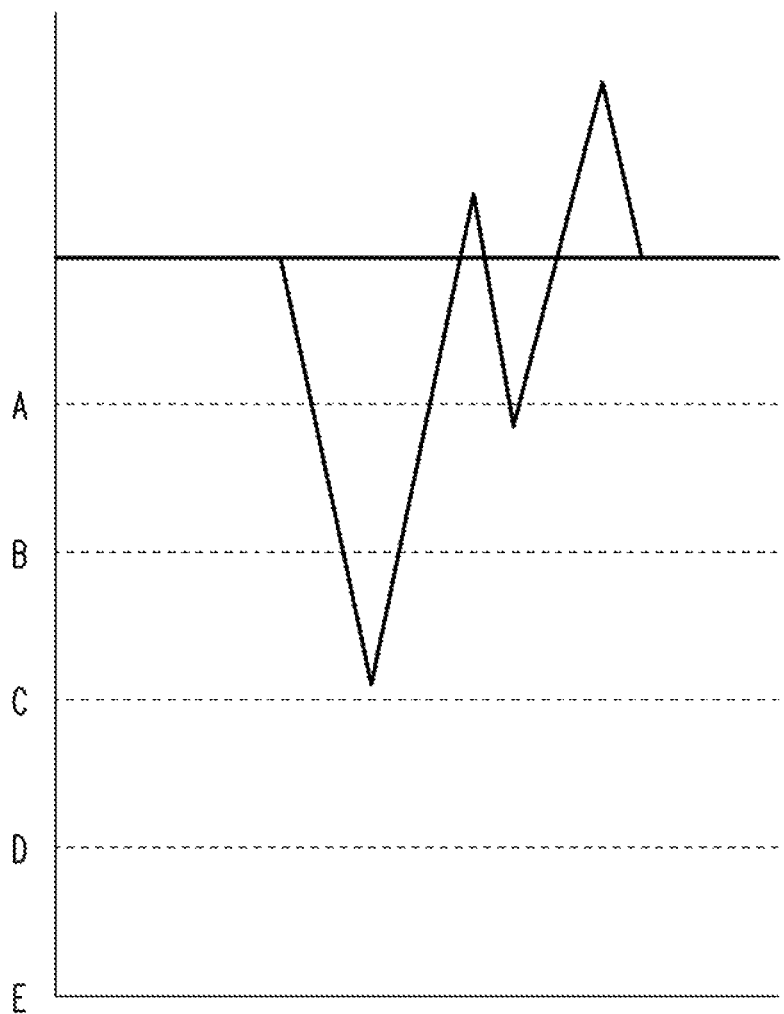
FIG. 6 is a chart illustrating voltage levels of a comparison voltage and an example of a power supply determination waveform.

Here, the voltage levels A to E will be explained with reference to FIG. 6. FIG. 6 illustrates the voltage levels A to E and an example of a power supply determination waveform.

In this embodiment, if the voltage level of the power supply voltage when the voltage drops due to the influence of the power supply noise generated when the transition delay test is conducted is higher than the voltage level A, the test can be conducted on 100% of the total number of flip-flops included in the internal circuit 21. If the voltage level of the power supply voltage when the voltage drops is between the voltage level A and the voltage level B, the test can be conducted on 80% of the total number of flip-flops included in the internal circuit 21, and the test is conducted with the internal circuit 21 being n-divided by the number of 80% or less of the total number of flip-flops. Further, if the voltage level of the power supply voltage when the voltage drops is between the voltage level B and the voltage level C, the test can be conducted on 60% of the total number of flip-flops included in the internal circuit 21, and the test is conducted with the internal circuit 21 being n-divided by the number of 60% or less of the total number of flip-flops. If the voltage level of the power supply voltage when the voltage drops is between the voltage level C and the voltage level D, the test can be conducted on 40% of the total number of flip-flops included in the internal circuit 21, and the test is conducted with the internal circuit 21 being n-divided by the number of 40% or less of the total number of flip-flops. Further, if the voltage level of the power supply voltage when the voltage drops is between the voltage level D and the voltage level E, the test can be conducted on 20% of the total number of flip-flops included in the internal circuit 21, and the test is conducted with the internal circuit 21 being n-divided by the number of 20% or less of the total number of flip-flops. For example, in the power supply determination waveform exemplified in FIG. 6, since the voltage level of the power supply voltage when the voltage drops most is between the voltage level B and the voltage level C, the test is conducted with the internal circuit 21 being n-divided by the number of 60% or less of the total number of flip-flops. Note that the resistance values of the resistors R1 to R6 are set so that the voltage levels A to E take the aforementioned voltages.

The register 33 is supplied with the outputs of the comparators 32-A, 32-B, 32-C, 32-D, 32-E included in the determination part 31 and holds the outputs. The comparison part 34 compares a table (a standard table) stored in the storage part 35 in advance to the value held in the register 33, and outputs a result to the testing device 10 based on the comparison result. By outputting the comparison result to the table stored in advance to the testing device 10, the signal amount necessary for information transmission can be reduced as compared to the case where the output of each of the comparators 32-A to 32-E as it is to the testing device 10. Note that there is a sufficient transmission band between the testing device 10 and the detection circuit 23 of the semiconductor device 20, the output of each of the comparators 32-A to 32-E included in the determination part 31 may be outputted to the testing device 10 as it is.

FIG. 3A and FIG. 3B are diagrams for explaining examples of the clock control circuit 22 of the semiconductor device 20. FIG. 3A and FIG. 3B each illustrate the clock control circuit 22 supplying clocks to the circuit blocks 21-*a*, 21-*b*, 21-*c*, 21-*d*, 21-*e* while not interrupting the clocks but adjusting (shifting) the phases thereof.

FIG. 3A is a block diagram illustrating a configuration example of the clock control circuit 22. In FIG. 3A, numerals 41-*a*, 41-*b*, 41-*c*, 41-*d*, 41-*e* denote delay devices each delaying the inputted signal by a predetermined delay amount and outputting it, and the clocks (CLK) from the testing device 10 are inputted into the delay devices. When the delay amount of the delay device 41-*a* is Z1, the delay amount of the delay device 41-*b* is Z2, the delay amount of the delay device 41-*c* is Z3, the delay amount of the delay device 41-*d* is Z4, and the delay amount of the delay device 41-*e* is Z5, the delay amounts Z1, Z2, Z3, Z4, Z5 are different from one another. Further, each of the delay amounts Z1, Z2, Z3, Z4, Z5 is shorter than one cycle of the inputted clock (CLK).

Further, numerals 42-*a*, 42-*b*, 42-*c*, 42-*d*, 42-*e* denote selectors for supplying clocks to the corresponding circuit blocks 21-*a*, 21-*b*, 21-*c*, 21-*d*, 21-*e*. The selector 42-*a*, into which the clock (CLK) and the output of the delay device 41-*a* are inputted, selects one of the clock (CLK) and the output of the delay device 41-*a* based on the control signal CTL from the testing device 10 and outputs the selected one to the circuit block 21-*a*. The selector 42-*b*, into which the clock (CLK) and the output of the delay device 41-*b* are inputted, selects one of them based on the control signal CTL and outputs the selected one to the circuit block 21-*b*. The selector 42-*c*, into which the clock (CLK) and the output of the delay device 41-*c* are inputted, selects one of them based on the control signal CTL and outputs the selected one to the circuit block 21-*c*. The selector 42-*d*, into which the clock (CLK) and the output of the delay device 41-*d* are inputted, selects one of them based on the control signal CTL and outputs the selected one to the circuit block 21-*d*. The selector 42-*e*, into which the clock (CLK) and the output of the delay device 41-*e* are inputted, selects one of them based on the control signal CTL and outputs the selected one to the circuit block 21-*e*.

In other words, the selector 42-*a* outputs the clock (CLK) or a clock (a delayed clock) made by delaying the clock (CLK) by the delay amount Z1 as a clock (CLK:a) to the circuit block 21-*a*. The selector 42-*b* outputs the clock (CLK) or a clock made by delaying the clock (CLK) by the delay amount Z2 as a clock (CLK:b) to the circuit block 21-*b*. The selector 42-*c* outputs the clock (CLK) or a clock made by delaying the clock (CLK) by the delay amount Z3 as a clock (CLK:c) to the circuit block 21-*c*. The selector 42-*d* outputs the clock (CLK) or a clock made by delaying the clock (CLK) by the delay amount Z4 as a clock (CLK:d) to the circuit block 21-*d*. The selector 42-*e* outputs the clock (CLK) or a clock made by delaying the clock (CLK) by the delay amount Z5 as a clock (CLK:e) to the circuit block 21-*e*.

FIG. 3B is a block diagram illustrating another configuration example of the clock control circuit 22. In FIG. 3B, numerals 43-*a*, 43-*b*, 43-*c*, 43-*d*, 43-*e* denote delay devices each delaying the inputted signal by a predetermined delay amount and outputting it, and the clock (CLK) from the testing device 10 is inputted into each of the delay devices. The delay device 43-*a* outputs its output to the circuit block 21-*a* as the clock (CLK:a), and the delay device 43-*b* outputs its output to the circuit block 21-*b* as the clock (CLK:b). The delay device 43-*c* outputs its output to the circuit block 21-*c* as the clock (CLK:c), and the delay device 43-*d* outputs its output to the circuit block 21-*d* as the clock (CLK:d). The delay device 43-*e* outputs its output to the circuit block 21-*e* as the clock (CLK:e).

Here, the delay amounts Z1, Z2, Z3, Z4, Z5 of the delay devices 43-*a*, 43-*b*, 43-*c*, 43-*d*, 43-*e* are independently controlled by the control signals CTL from the testing device 10. The delay amounts Z1, Z2, Z3, Z4, Z5 are delay amounts each shorter than one cycle of the inputted clock (CLK), and they may be different from one another or a part or all of them may be the same.

The clock control circuit 22 illustrated in each of FIG. 3A or FIG. 3B can supply clocks to the circuit blocks 21-*a*, 21-*b*, 21-*c*, 21-*d*, 21-*e* while not interrupting the clocks but shifting the phases thereof as necessary. For example, in FIG. 3A, the selectors 42-*a* to 42-*e* select the outputs of the corresponding delay devices 41-*a* to 41-*e* to thereby perform phase adjustment, so that the clocks can be supplied to the circuit blocks 21-*a* to 21-*e* with the phases thereof being made different from one another as illustrated in FIG. 3C. Further, for example, by making the delay amounts of the delay devices 43-*a* to 43-*e* different from one another in FIG. 3B, the clocks can be supplied to the circuit blocks 21-*a* to 21*e* with phases thereof being made different from one another as illustrated in FIG. 3C.

FIG. 4A and FIG. 4B are diagrams for explaining another example of the clock control circuit 22 of the semiconductor device 20. FIG. 4A illustrates the clock control circuit 22 configured to control supply/interruption of the clocks to the circuit blocks 21-*a*, 21-*b*, 21-*c*, 21-*d*, 21-*e* by employing a so-called gated clock technique.

FIG. 4A is a block diagram illustrating a configuration example of the clock control circuit 22. In FIG. 4A, numerals 51-*a*, 51-*b*, 51-*c*, 51-*d*, 51-*e* denote gate circuits each of which is composed of a logical product operation circuit (an AND circuit) in the example illustrated in FIG. 4A. Each of the gate circuits 51-*a* to 51-*e*, into which the clock (CLK) and the control signal CTL from the testing device 10 are inputted, switches whether to output (supply) or not (interrupt) the clock (CLK) according to the control signal CTL. In short, when the AND circuit is used as the gate circuit as illustrated in FIG. 4A, the clock will be outputted when the control signal CTL is true, whereas the clock will be interrupted when the control signal CTL is false.

The gate circuit 51-*a* outputs its output to the circuit block 21-*a* as the clock (CLK:a), and the gate circuit 51-*b* outputs its output to the circuit block 21-*b* as the clock (CLK:b). The gate circuit 51-*c* outputs its output to the circuit block 21-*c* as the clock (CLK:c), and the gate circuit 51-*d* outputs its output to the circuit block 21-*d* as the clock (CLK:d). The gate circuit 51-*e* outputs its output to the circuit block 21-*e* as the clock (CLK:e).

The clock control circuit 22 illustrated in FIG. 4A can be used to control supply and interruption of the clocks to the circuit blocks 21-*a*, 21-*b*, 21-*c*, 21-*d*, 21-*e*. For example, in FIG. 4A, the control signals CTL supplied to the gate circuits 51-*a*, 51-*b*, 51-*c* are set to be true and the control signals CTL supplied to the gate circuits 51-*d*, 51-*e* are set to be false. Thereafter, the control signals CTL supplied to the gate circuits 51-*a*, 51-*b*, 51-*c* are set to be false and the control signals CTL supplied to the gate circuits 51-*d*, 51-*e* are set to be true. Such a control makes it possible to supply the clocks only to the circuit blocks 21-*a*, 21-*b*, 21-*c* and then supply the clocks only to the circuit blocks 21-*d*, 21-*e* as illustrated in FIG. 4B.

A semiconductor device test method in this embodiment will be explained next.

Figure 5:
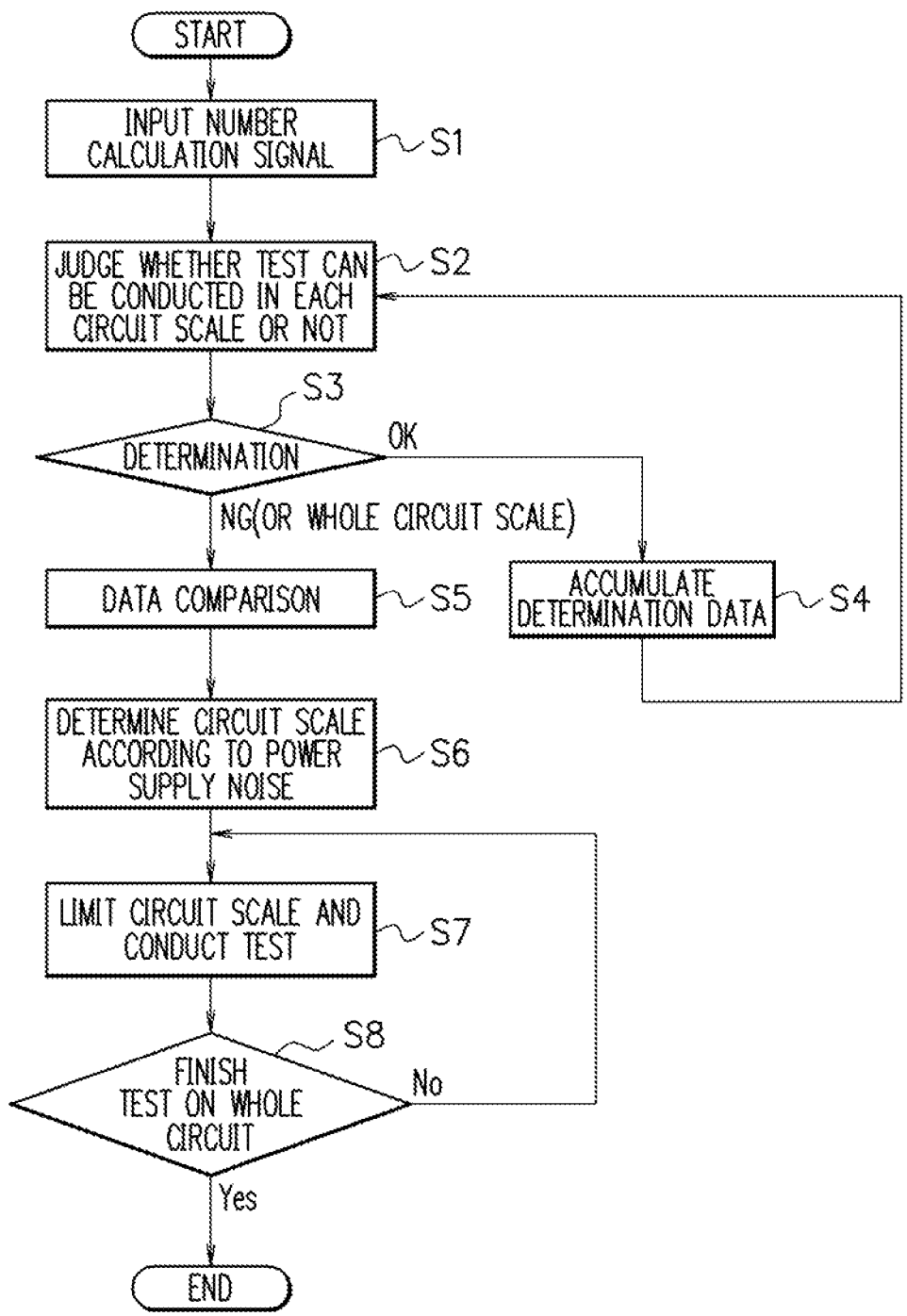
FIG. 5 is a flowchart illustrating an example of a semiconductor device test method in this embodiment.

FIG. 5 is a flowchart illustrating an example of a semiconductor device test method in this embodiment.

When operation is started, the testing device 10 first inputs a flip-flop number calculation signal into the semiconductor device 20 that is the test object (S1). For example, the testing device 10 generates the flip-flop number calculation signal in the signal generation part 12 based on the control by the control part 11, and outputs it to the semiconductor device 20. Note that the flip-flop number calculation signal is a signal similar to the signal inputted when the transition delay test is conducted concurrently in the whole semiconductor device 20 without limiting the number of concurrently operating flip-flops (the circuit scale) in the semiconductor device 20.

Next, the testing device 10 judges whether the transition delay test in each circuit scale can be conducted or not in the internal circuit 21 of the semiconductor device 20 (S2 to S4). In this event, the testing device 10 outputs the control signal to the clock control circuit 22 in the semiconductor device 20 to change the control signal so that the number of concurrently operating flip-flops increase in sequence (the circuit scale on which test is conducted becomes larger in sequence), and judges whether the transition delay test can be conducted in each of the circuit scales or not.

More specifically, the testing device 10 conducts a determination test similarly to the transition delay test in a manner that one of the five divided circuit blocks 21-*a* to 21-*e* operates at a time (two or more circuit blocks do not concurrently operate) (a circuit scale of 20%). Next, the testing device 10 conducts a determination test in a manner that two of the five divided circuit blocks 21-*a* to 21-*e* operate at a time (a circuit scale of 40%). Hereinafter, the testing device 10 similarly conducts a determination test in a manner that three (a circuit scale of 60%), four (a circuit scale of 80%), and five (a circuit scale of 100%) of the five divided circuit blocks 21-*a* to 21-*e* operate in sequence.

The determination test similar to the transition delay test is repeatedly conducted while gradually increasing the circuit scale as described above, and the testing device 10 compares, every time one determination test is conducted, the changed signal (the operation result of the internal circuit) to the expected value and determines whether they coincide with each other or not (S3). As a result, when the changed signal coincides with the expected value (OK), the testing device 10 accumulates the circuit scale operating at that time as the determination data (S4), and conducts a next determination test. On the other hand, when the changed signal does not coincide with the expected value (NG) or when the test is finished at the whole circuit scale (the circuit scale of 100%), the testing device 10 causes the detection circuit 23 in the semiconductor device 20 to perform data comparison (S5), and acquires the measurement result relating to the power supply noise. Thus, the information relating to the power supply noise amount with which the changed signal does not coincide with the expected value can be acquired in the transition delay test.

Next, the testing device 10 determines the circuit scale on which the transition delay test can be normally conducted without being affected by the influence of the power supply noise, based on the result obtained by the aforementioned operation (the accumulated determination data and the measurement result relating to the power supply noise acquired from the detection circuit 23) (S6). For example, when the determination is NG in the determination test with the concurrently operating circuit scale set to 40%, the testing device 10 decides to limit the concurrently operating circuit scale in the transition delay test to 20%, and when the determination is NG in the determination test with the concurrently operating circuit scale set to 80%, the testing device 10 decides to limit the concurrently operating circuit scale in the transition delay test to 60%.

Subsequently, the testing device 10 limits the concurrently operating circuit scale in the transition delay test to the circuit scale decided at step S6, namely, sets the concurrently operating circuit scale not to exceed the decided circuit scale decided at step S6, and conducts the transition delay test of the semiconductor 20 (S7). For example, when the concurrently operating circuit scale is limited to 20%, the transition delay test is conducted such that the clock control circuit 22 controls the clocks to be supplied to the circuit blocks 21-*a* to 21-*e* so that one of the circuit blocks 21-*a* to 21-*e* operates at a time (two or more of the circuit blocks do not concurrently operate). For example, by supplying clocks to the circuit blocks 21-*a* to 21-*e* with the phases being made different from one another as illustrated in FIG. 3C, the circuit blocks 21-*a* to 21-*e* can be controlled to operate one by one. Further, the control of supplying the clock only to one circuit block and interrupting the clocks to the other circuit blocks is conducted for each of the circuit blocks 21-*a* to 21-*e*, whereby the circuit blocks 21-*a* to 21-*e* can be controlled to operate one by one.

Further, for example, when the concurrently operating circuit scale is limited to 60%, the transition delay test is conducted such that the clock control circuit 22 controls the clocks to be supplied to the circuit blocks 21-*a* to 21-*e* to cause three circuit blocks (for example, the circuit block 21-*a*, 21-*b*, 21-*c*) of the circuit blocks 21-*a* to 21-*e* to concurrently operate and the remaining two circuit blocks (for example, the circuit blocks 21-*d*, 21-*e*) to concurrently operate. For example, the phases of the three clocks of the clocks to be supplied to the circuit blocks 21-*a* to 21-*e* are synchronized and the phases of the remaining two clocks are synchronized shifted from the phases of the three clocks, whereby the concurrently operating circuit scale can be limited to 60%. Further, for example, by controlling supply/interruption of the clocks as illustrated in FIG. 4A and FIG. 4B, the concurrently operating circuit scale can be limited to 60%.

Note that the above-explained clock control example is one example, and the clock control is not limited to this example.

The testing device 10 then conducts test until conduction of the transition delay test to the whole internal circuit 21 of the semiconductor device 20, namely, all of the circuit blocks 21-a to 21-e is completed, and ends the operation when conduction of the transition delay test to the whole internal circuit 21 is completed (S8).

According to this embodiment, a determination test is conducted with the concurrently operating circuit blocks (the flip-flop number) being changed to determine an appropriate circuit scale on which the transition delay test can be normally conducted without being affected by the influence of the power supply noise as a result of the determination test and a measurement result relating to the power supply noise generated during the conduction of the determination test. Then, the concurrently operating circuit scale in the transition delay test is limited not to exceed the appropriate circuit scale obtained by the determination, and the transition delay test to the semiconductor device 20 is conducted. This makes it possible to conduct the transition delay test with the appropriate circuit scale on which the test can be normally conducted without being affected by the influence of the power supply noise, and to suppress occurrence of inconvenience that a semiconductor device 20 that will be determined as non-defective without influence of the noise is determined as defective due to the influence of the noise.

Further, the transition delay test is not conducted with the internal circuit 21 of the semiconductor device 20 being just divided, but the transition delay test can be conducted with the appropriate circuit scale on which the test can be normally conducted, so that the transition delay test can be efficiently conducted on the whole semiconductor device 20. For example, when the total number of the circuit blocks on which the transition delay test has not been conducted in the internal circuit 21 is equal to or more than the circuit scale that has been determined to be normally subjected to the test, the clocks are controlled so that the circuit scale becomes equal to the concurrently operating circuit blocks in the transition delay test. This makes it possible to conduct the transition delay test on the whole semiconductor device 20 at a smallest number of execution times.

Note that the case where the internal circuit 21 of the semiconductor device 20 is divided into five circuit blocks is illustrated as an example in the above explanation, the division number is not limited to this. The division number of the internal circuit 21 is arbitrary, and the configuration of the determination part 31 and the like of the detection circuit 23 may be changed as necessary according to the division number of the internal circuit 21. Further, in this embodiment, the internal circuit 21 of the semiconductor device 20 is divided into five blocks, and the circuit scale suitable for conduction of the transition delay test is decided while the concurrently operating circuit scale is changed to 20%, 40%, 60%, 80%, 100%. However, not limited to this, the concurrently operating circuit scale suitable for conduction of the transition delay test may be decided, for example, while the concurrently operating circuit scale is changed to 20%, 60%, 100%.

A disclosed semiconductor device test method achieves the effect capable of determining an appropriate circuit scale on which the operation test can be normally conducted without being affected by influence of a power supply noise, based on a result of the determination test conducted with the concurrently operating circuit blocks changed and the power supply noise generated during the conduction of the determination test, and conducting an operation test on a test object circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device test method, comprising:
performing a determination test of a test object circuit of the semiconductor device divided into a plurality of circuit blocks, while changing a scale of concurrently operating circuit blocks in the plurality of circuit blocks;
detecting a power supply noise generated in the semiconductor device during performance of the determination test;
determining a scale of the circuit blocks that an operation test is performed successfully based on a result of the determination test that was performed and the power supply noise that was detected; and
performing the operation test on the test object circuit by controlling clocks to be supplied to the circuit blocks so that the scale of concurrently operating circuit blocks does not exceed the scale of the circuit blocks that was determined.

2. The semiconductor device test method according to claim 1,
wherein in the performing the operation test, phases of the clocks to be supplied to the circuit blocks are adjusted so that the scale of concurrently operating circuit blocks does not exceed the scale of the circuit blocks that was determined.

3. The semiconductor device test method according to claim 1,
wherein in the performing the operation test, a supply and an interruption of the clock to each of the circuit blocks are controlled so that the scale of concurrently operating circuit blocks does not exceed the scale of the circuit blocks that was determined.

4. The semiconductor device test method according to claim 1,
wherein in the performing the operation test, the clocks to be supplied to the circuit blocks so that the scale of concurrently operating circuit blocks is equal to the scale of the circuit blocks that was determined when the scale of the circuit blocks on which the operation test has not been performed of the test object circuit is equal to or more than the scale of the circuit blocks that was determined.

5. The semiconductor device test method according to claim 1,
wherein in the detecting, the power supply noise is detected by comparing a comparison voltage generated based on a reference power supply and a power supply voltage of the semiconductor device during performance of the determination test.

6. The semiconductor device test method according to claim 1,
wherein the scale of each of the circuit blocks is the same.

7. The semiconductor device test method according to claim 1,
wherein the test object circuit is divided into the plurality of circuit blocks so that the numbers of flip-flops included in the circuit blocks are substantially equal.

8. A semiconductor device, comprising:

a test object circuit divided into a plurality of circuit blocks;

a clock control circuit controlling a clock to be supplied to each of the circuit blocks; and a detection circuit detecting a power supply noise generated during a period when a determination test on the test object circuit is performed while changing a number of concurrently operating circuit block;

wherein in performing an operation test on the test object circuit, the clock control circuit controls the clock to be supplied to each of the circuit blocks, according to a number of concurrently operable circuit blocks decided based on the power supply noise detected by the detection circuit.

9. The semiconductor device according to claim 8, wherein the clock control circuit adjusts phases of each of the clock to be supplied to the plurality of circuit blocks according to the number of concurrently operable circuit blocks.

10. The semiconductor device according to claim 9, wherein the clock control circuit shifts the phases of each of the clock to be supplied to the plurality of circuit blocks so that a number of circuit blocks having synchronized phases of the supplied clocks is equal to or less than the number of the concurrently operable circuit blocks.

11. The semiconductor device according to claim 9, wherein the clock control circuit has a plurality of delay devices each disposed to each of the circuit blocks and capable of independently controlling a delay amount, and wherein the delay device delays an inputted clock by the delay amount and outputs a delayed clock to the corresponding circuit block.

12. The semiconductor device according to claim 9, wherein the clock control circuit has a plurality of sets of a delay device and a selector disposed to the circuit blocks respectively, wherein the delay device delays an inputted clock by a set delay amount and outputs a delayed clock, and wherein the selector, into which the clock and the delayed clock are inputted, outputs one of the clock and the delayed clock to the corresponding circuit block according to control from an external part.

13. The semiconductor device according to claim 8, wherein the clock control circuit controls a supply and an interruption of the clock to each of the circuit blocks according to the number of concurrently operable circuit blocks.

14. The semiconductor device according to claim 13, wherein the clock control circuit has gate circuits each disposed to each of the circuit blocks and switching between the supply and the interruption of the clock to the corresponding circuit block.

15. A semiconductor device test method, comprising:

determining a scale of the circuit blocks that an operation test is performed successfully based on a result of a determination test of a test object circuit of the semiconductor device divided into a plurality of circuit blocks performed while changing a scale of concurrently operating circuit blocks in the plurality of circuit blocks and a power supply noise detected in the semiconductor device during performance of the determination test; and performing the operation test on the test object circuit outputting a control signal relating to control of clocks to be supplied to the circuit blocks so that the scale of concurrently operating circuit blocks does not exceed the scale of the circuit blocks that was determined.

* * * * *